(12) United States Patent
Lee et al.

(10) Patent No.: US 6,250,375 B1
(45) Date of Patent: Jun. 26, 2001

(54) CLIP FOR SECURING HEAT SINK TO ELECTRONIC DEVICE

(75) Inventors: Hsieh Kun Lee, Chung-Ho (TW); Zhi Sheng Lin, ShengZheng (CN)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/686,209

(22) Filed: Oct. 10, 2000

(30) Foreign Application Priority Data

Jul. 1, 2000 (TW) ................................................ 089211344

(51) Int. Cl.[7] .................................................... F28F 7/00
(52) U.S. Cl. .................... 165/80.3; 165/185; 361/707; 361/704; 257/719; 257/727; 257/726; 24/458; 24/459; 174/16.3
(58) Field of Search .......................... 165/80.3, 104.33, 165/185; 24/458, 459; 174/16.3; 257/706, 718, 719, 727, 726; 361/709, 697, 704, 715, 702, 707

(56) References Cited

U.S. PATENT DOCUMENTS

| | | | | |
|---|---|---|---|---|
| 5,617,292 | * | 4/1997 | Steiner | 361/704 |
| 5,684,676 | * | 11/1997 | Lin | 174/16.3 |
| 5,771,960 | * | 6/1998 | Lin | 165/80.3 |
| 5,828,553 | * | 10/1998 | Chiou | 24/458 |
| 5,870,288 | * | 2/1999 | Chen | 257/718 |
| 5,933,326 | * | 8/1999 | Lee et al. | 361/704 |
| 5,953,212 | * | 9/1999 | Lee | 165/185 |
| 5,991,152 | * | 11/1999 | Chiou | 361/704 |
| 6,082,440 | * | 7/2000 | Clemens et al. | 165/80.3 |
| 6,108,207 | * | 8/2000 | Lee | 165/80.3 |
| 6,111,752 | * | 8/2000 | Huang et al. | 165/80.3 |
| 6,118,661 | * | 9/2000 | Lo | 257/719 |
| B1 6,188,577 | * | 2/2001 | Liu | 361/704 |

* cited by examiner

Primary Examiner—Ira S. Lazarus
Assistant Examiner—Terrell McKinnon
(74) Attorney, Agent, or Firm—Wei Te Chung

(57) ABSTRACT

A clip (10) includes a body (12) and a fastener (14). The body has a leg (26) depending at an end thereof for engaging with a retention module (50), and a central pressing tab (24) for being received in a groove (76) defined in a heat sink (70). The body further has a joint portion (28) at another end thereof. Cutouts (33) are defined in the joint portion to form a pair of deformable protrusions (35) and a U-shaped head (36). A rib (38) is formed on the body for reinforcing the clip. The fastener has a retaining portion (42). The retaining portion includes a slot (44) for receiving the head, and an aperture (46) for engaging with an ear (64) formed on the retention module. The protrusions are deformed to secure the fastener to the body.

14 Claims, 5 Drawing Sheets

CLIP FOR SECURING HEAT SINK TO ELECTRONIC DEVICE

BACKGROUND

1. Field of the Invention

The present invention relates to a clip for a heat sink, and particularly to a clip readily securing a heat sink to a heat-generating electronic device.

2. The Related Art

A heat sink is usually placed in contact with an electronic device, such as a Central Processing Unit (CPU), for removing heat therefrom. The electronic device is often mounted on a socket connector of a printed circuit board (PCB). Various clips have been used for securing the heat sink to the socket connector.

A conventional clip comprises a base and a pair of spring portions extending from opposite ends of the base. A pair of legs, each with an aperture defined therein, depends from respective outer ends of the spring portions. The apertures engage with ears formed on a socket connector, thereby securing a heat sink to the socket connector. However, a tool is required during assembly, which makes the assembly procedure complicated. U.S. Pat. No. 5,671,118 discloses a clip with a hinged locking leg which may facilitate operation thereof.

Furthermore, contemporary heat sinks are being made with more and more fins, to enhance their heat transfer capability. This makes such heat sinks large and heavy. Conventionally, a pair of retention modules is mounted on a PCB on opposite sides of a socket connector, for securely attaching the heat sink to the electronic device. The pressing point of a conventional clip, which acts on the heat sink, usually does not coincide with a center of the clip. This results in an eccentric moment between the pressing point and the center of the clip. The eccentric moment can cause the heat sink to be dislodged from the electronic device when the system is subjected to shock or vibration during normal operation.

Thus, a clip for readily and firmly attaching a heat sink to an electronic device is required.

SUMMARY OF THE INVENTION

Accordingly, an object of the present invention is to provide a clip which readily and securely attaches a heat sink to an electronic device.

To achieve the above-mentioned object, a clip of the present invention includes a body and a fastener. The body includes a leg, a central pressing tab, and a joint portion. The leg depends at an end of the body, for engaging with a retention module mounted on a PCB. The pressing tab is receivable in a groove defined in a base of a heat sink. The joint portion is formed at an end of the body opposite the leg. A pair of cutouts is defined in the joint portion, thereby forming a pair of protrusions. The protrusions are bent the head, and an aperture for engaging with an ear formed on the retention module. The protrusions are deformed to secure the fastener to the body.

Other objects, advantages and novel features of the present invention will be drawn from the following detailed embodiments of the present invention with attached drawings.

DESCRIPTION OF THE PREFERRED EMBODIMENTS

Figure 1:
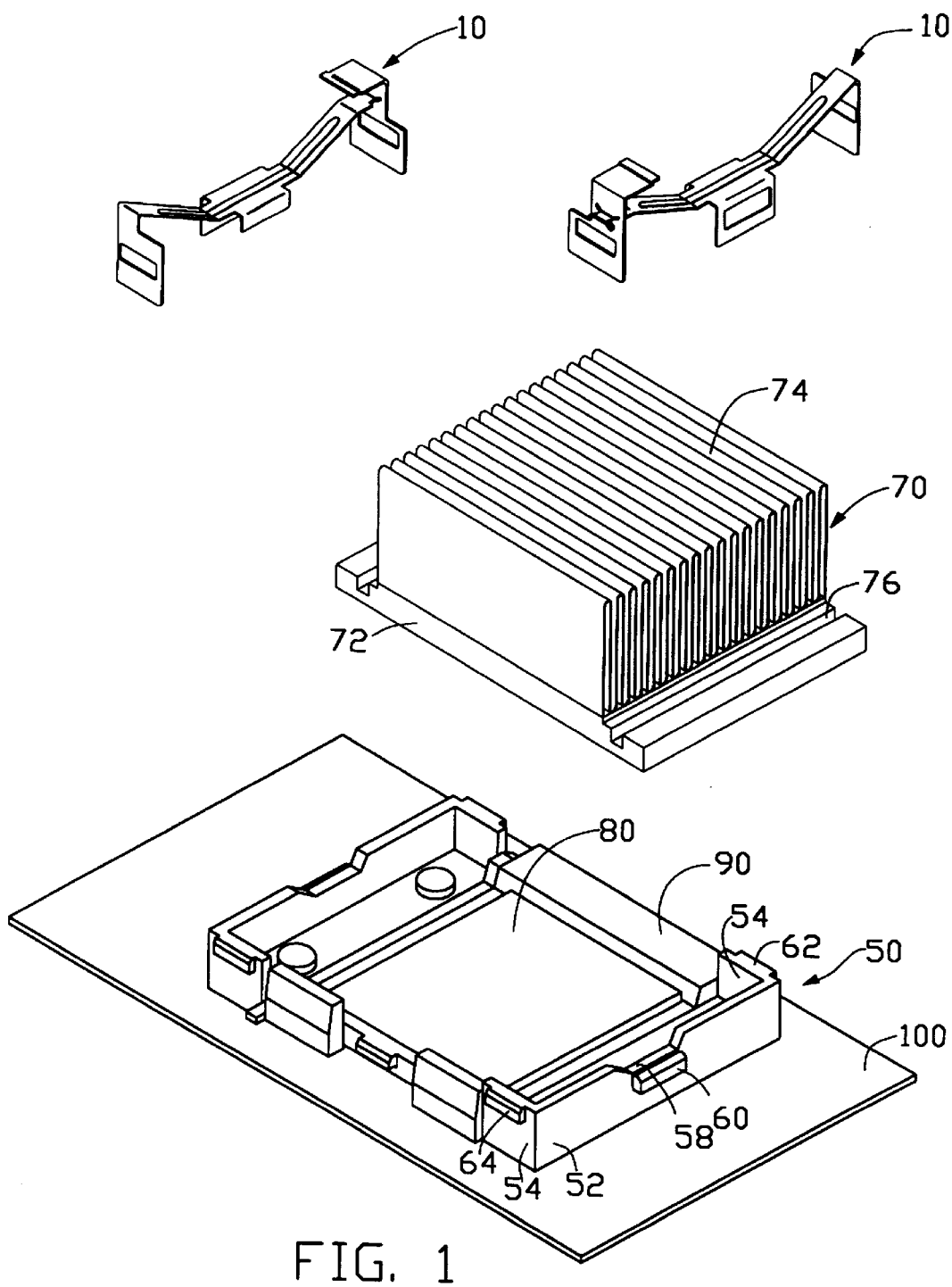
FIG. 1 is an exploded view showing a pair of clips in accordance with a preferred embodiment of the present invention, for securing a heat sink to an electronic device.

FIG. 1 shows a pair of clips 10 in accordance with the present invention, for securing a heat sink 70 to an electronic device 80. The electronic device 80 is retained on a socket connector 90 between a pair of retention modules 50. The socket connector 90 and the retention modules 50 are mounted on a print circuit board 100. The retention modules 50 are on opposite sides of the socket connector 90, thereby defining a receiving space (not labeled) for receiving the heat sink 70. Each retention module 50 has a pair of sidewalls 54 at respective opposite ends thereof, and a front wall 52. The front wall 52 defines a cutout 58 in a top surface thereof, and an external catch 60 below the cutout 58. First and second ears 62, 64 project externally from the respective sidewalls 54.

The heat sink 70 comprises a base 72 and a plurality of fins 74. The fins 74 extend upwardly from a top surface of the base 72. A pair of parallel grooves 76 is defined in the base 72 on respective opposite sides of the plurality of fins 74.

Figure 2:
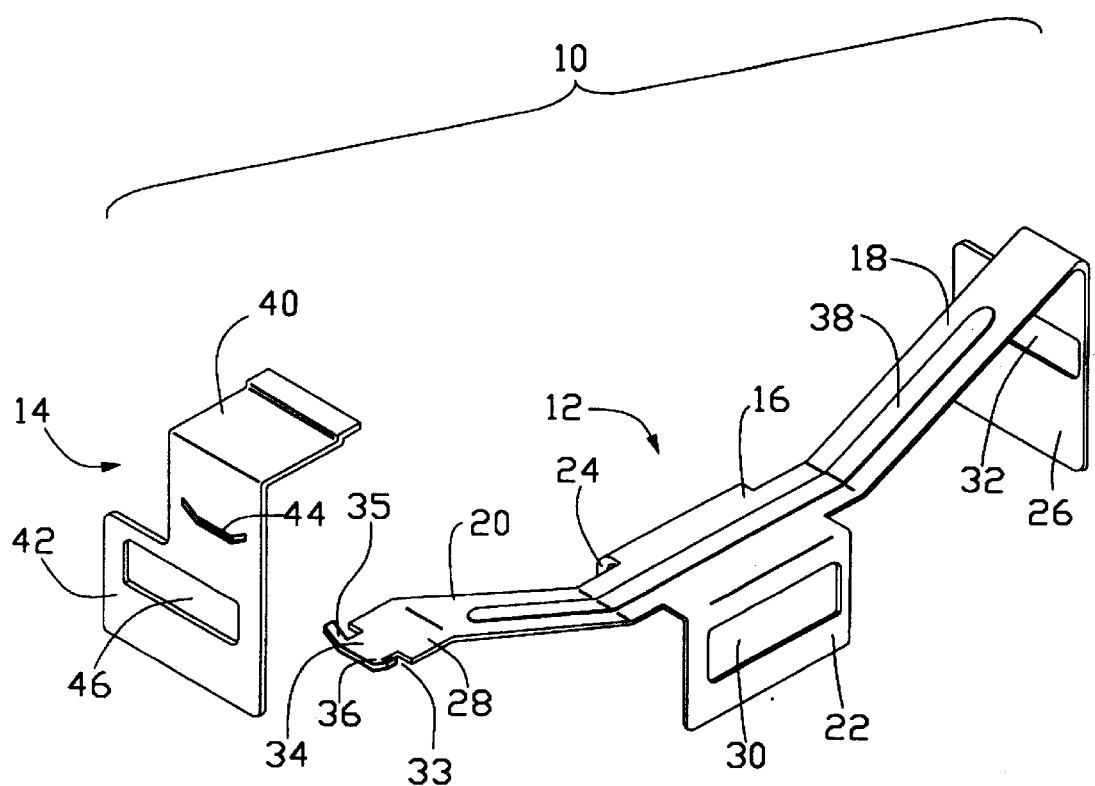
FIG. 2 is exploded view of one clip of FIG. 1.

Referring also to FIG. 2, each clip 10 in accordance with the present invention comprises an elongate body 12 and a fastener 14.

The body 12 of each clip 10 comprises a central pressing portion 16, first and second spring portions 18, 20, a wing 22, a pressing tab 24, a leg 26, and a joint portion 28. The first and second spring portions 18, 20 extend outwardly and upwardly from respective opposite ends of the pressing portion 16. The wing 22 depends from a lateral edge of the pressing portion 16. An opening 30 is defined in the wing 22. The pressing tab 24 depends from an opposite lateral edge of the pressing portion 16. The leg 26 depends from an outer end of the first spring portion 18. A first aperture 32 is defined in the leg 26. A rib 38 is formed on a top surface of the pressing portion 16 and the first and second spring portions 18, 20, for reinforcing the clip.

The joint portion 28 of the body 12 extends from a distal end of the second spring portion 20. A pair of opposite side cutouts 33 is respectively defined in the joint portion 28. Accordingly, a section of the joint portion 28 between the cutouts 33 forms a neck 34, and an end section of the joint portion 28 forms a pair of opposite side protrusions 35. The protrusions 35 are bent slightly upwards. An end section of the joint portion 28 together with the protrusions 35 constitutes a U-shaped head 36.

Each fastener 14 is generally L-shaped, and comprises an operation portion 40 and a retaining portion 42. The retaining portion 42 depends from an edge of the operation portion 40. The retaining portion 42 defines a slot 44 therein. The slot 44 is dimensioned to receive to the head 36 of the body 12 therein. A second aperture 46 is formed in the retaining portion 42, and is located below the slot 44.

Figure 3:
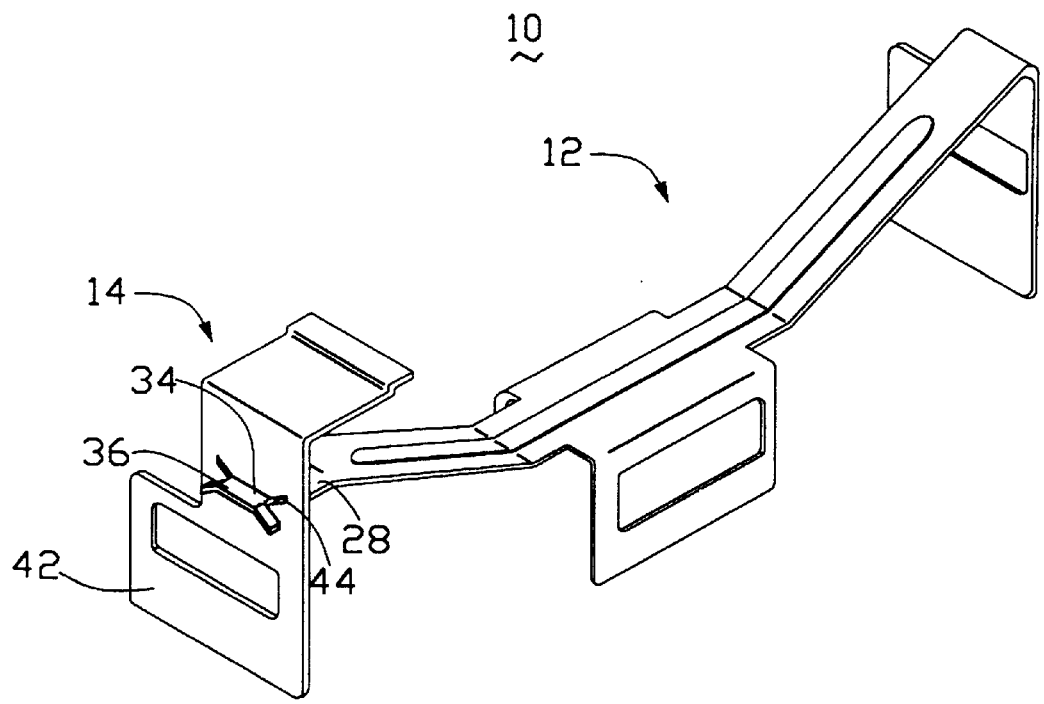
FIG. 3 is an assembled view of FIG. 2.

Referring also to FIG. 3, in pre-assembly, each fastener 14 is attached to its corresponding body 12. The head 36 of the body 12 is inserted through the slot 44 of retention portion 42, until the neck 34 of the body 12 is disposed within the slot 44. Then the protrusions 35 of the head 36 are deformed downwardly, to prevent the head 36 from coming out of the slot 44. The fastener 14 is thereby securely retained to the body 12, rendering the clip 10 ready for use as a single unit.

Figure 4:
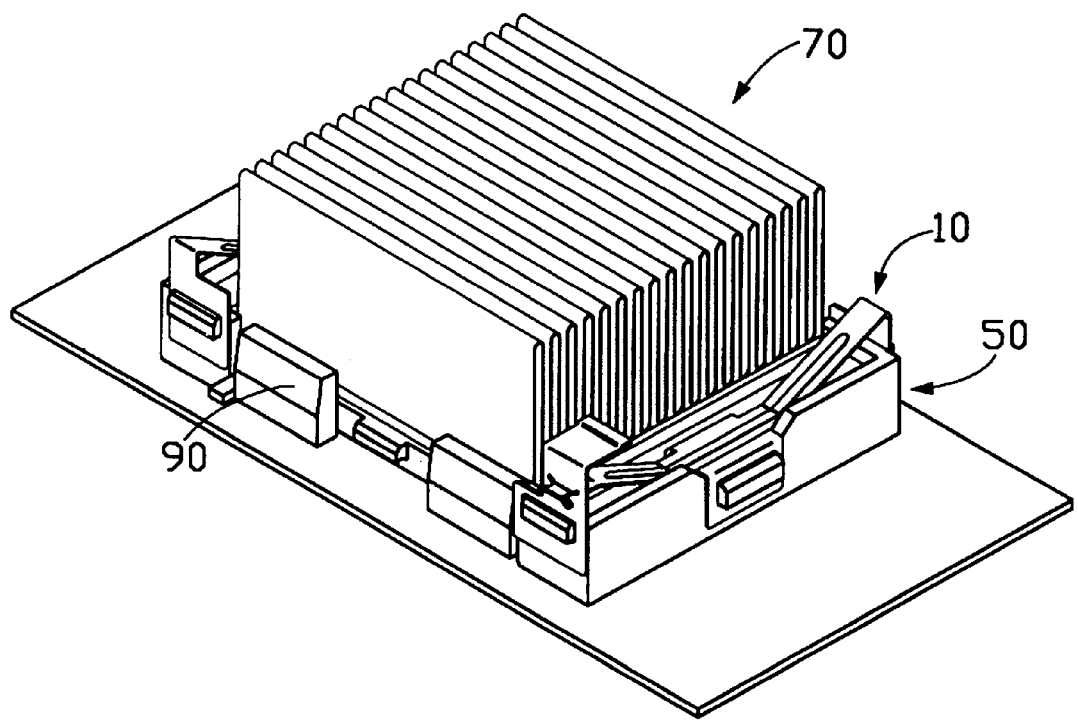
FIG. 4 is an assembled view of FIG. 1.

Referring also to FIG. 4, in assembly, the heat sink 70 is received in the receiving space (not labeled) defined by the retention modules 50. The base 72 of the heat sink 70 abuts an upper surface of the electronic device 80. A pair of clips 10 is placed on respective opposite sides of the plurality of fins 74 of the heat sink 70. The pressing tabs 24 of the clips 10 are received in the corresponding grooves 76 of the base 72, and abut respective walls (not labeled) of the base 72 which define respective outer limits of the grooves 76. The opening 30 of each clip 10 engages with the catch 60 of the corresponding retention module 50. The first aperture 32 of the clip 10 engages with the first ear 62 of the retention module 50. Then the operation portion 40 of the clip 10 is depressed such that the retaining portion 42 moves downwardly and simultaneously a bottom section of the retaining portion 42 moves slightly outwardly. The operation portion 40 is then released such that the bottom section of the retaining portion 42 moves inwardly and thereupon the second aperture 46 engages with the second ear 64 of the retention module 50. Thus the fastener 14 resiliently engages with the second ear 64 of the retention module 50. The heat sink 70 is thereby readily and firmly secured to the retention modules 50 by the clips 10.

To release each clip 10, the operation portion 40 of the clip 10 is depressed such that the retaining portion 42 of the fastener 14 is released from engagement with the second ear 64 of the retention module 50 and thereupon the bottom section of the retaining portion 42 moves outwardly. The clip 10 is then readily detached from the heat sink 70 and the retention module 50.

Figure 5:
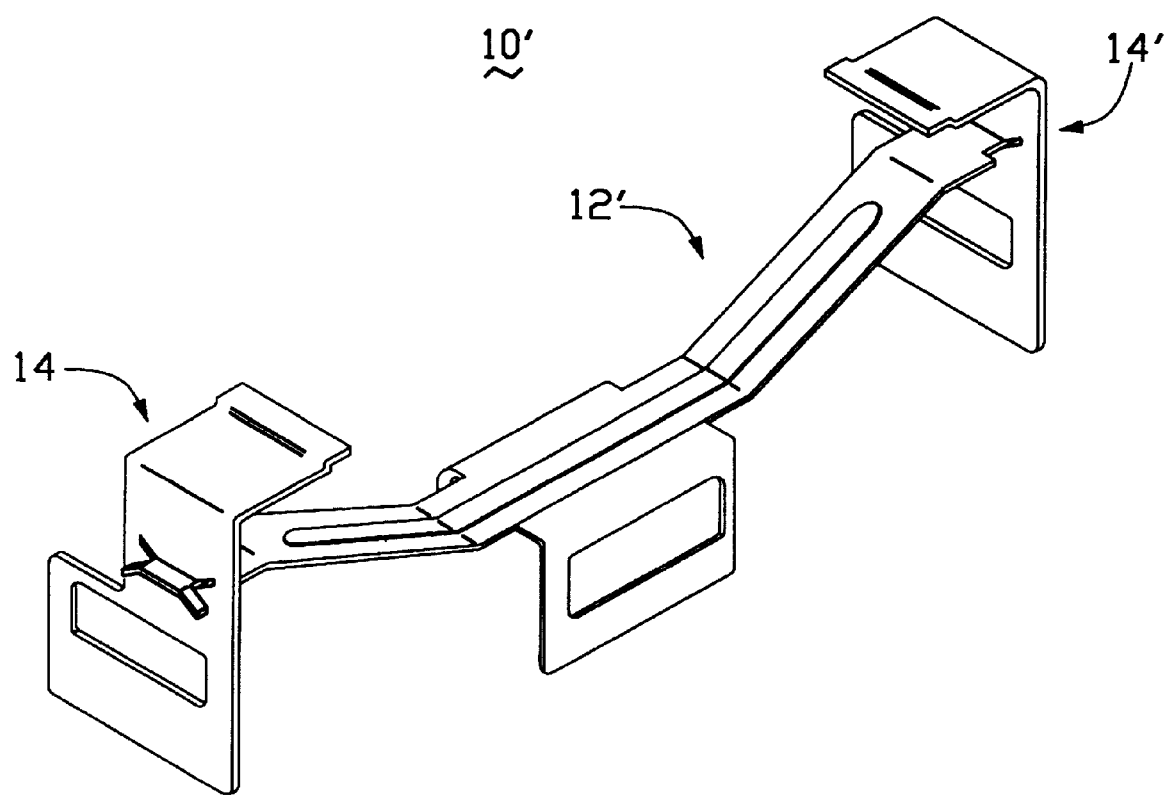
FIG. 5 is a perspective view of a clip in accordance with an alternative embodiment of the present invention.

Referring to FIG. 5, a clip 10' in accordance with an alternative embodiment of the present invention comprises a body 12' and a pair of fasteners 14'. The clip 10' is similar to the clip 10 of the preferred embodiment, except that the clip 10' does not have a first spring portion 18 or a first leg 26. Instead, the body 12' of the clip 10' comprises another spring portion similar to the second spring portion 20, and another joint portion similar to the joint portion 28. Further, the clip 10' comprises another fastener 14' similar to the fastener 14. For brevity, a detailed description of the clip 10' is omitted herein. Instead, reference is made to the detailed description of the clip 10, with due alteration of details.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A clip adapted to attach a heat sink to an electronic device retained on a socket connector between a pair of retention modules having a pair of opposite end ears and a side catch between said pair of ears, comprising:
   a body comprising a pressing portion adapted to press the heat sink toward the electronic device, a wing depending from an edge of the pressing portion adapted to engage with the catch of the retention module, and a joint portion extending from an end of the pressing portion; and
   a fastener movably attached to the joint portion and adapted to engage with the retention module.

2. The clip as described in claim 1, wherein the joint portion of the body forms a head, and wherein the fastener defines a slot for receiving the head therethrough.

3. The clip as described in claim 2, wherein the head comprises a plurality of protrusions, the protrusions being deformable to retain the fastener to the body.

4. The clip as described in claim 1, wherein the fastener further comprises an operation portion, for facilitating attachment and detachment of the clip.

5. The clip as described in claim 1, wherein a pressing tab depends from a lateral edge of the pressing portion of the body, the pressing tab being adapted to be received in a groove defined in the heat sink.

6. The clip as described in claim 1, wherein at least a rib is formed on the body to reinforce the clip.

7. The clip as described in claim 1, wherein the body comprises two joint portions at respective opposite ends thereof, and the clip comprises two fasteners movably attached to the respective joint portions.

8. A heat sink assembly comprising:
   a pair of retention modules each defining a pair of opposite end ears and a side catch between said pair of ears;
   a socket positioned between said pair of retention modules;
   an electronic device positioned on the socket;
   a heat sink positioned on the electronic device; and
   a pair of clips positioned on to opposite ends of the heat sink, each of said clips including a body and a fastener hinged on one end of the body, said body defining a central pressing portion with a wing downwardly extending from an outer edge thereof and latchably engaged with the catch, and a leg positioned by the other end of the central pressing portion and latchably engaged with one of said pair of ears, the fastener latchably engaged with the other of said pair of ears.

9. The assembly as described in claim 8, wherein a pressing tab extends downwardly from the central pressing portion opposite to said wing and is receivably engaged within a groove of the heat sink.

10. The assembly as described in claim 8, wherein said fastener includes a retention portion and an operation portion extending inwardly above the body.

11. The assembly as described in claim 8, wherein said leg is pivotally attached to said other end of the body.

12. A heat sink assembly comprising:
   a pair of retention modules each defining a pair of opposite end ears and a side catch between said pair of ears;
   a socket positioned between said pair of retention modules; an electronic device positioned on the socket;
   a heat sink positioned on the electronic device; and
   a pair of clips positioned on two opposite ends of the heat sink, each of said clips including a body and a fastener and a leg positioned at two opposite ends of the body and latchably engaged with the corresponding ears, said body defining a central pressing portion with a wing downwardly extending from an outer edge thereof and latchably engaged with the catch, and a pressing tab downwardly extending from an inner edge of the central pressing portion opposite to said wing and receiveably engaged within a groove of the heat sink.

13. The assembly as described in claim 12, wherein the fastener is hinged with regard to the body.

14. The assembly as described in claim 12, wherein both the fastener and the leg are hinged with regard to the body.

* * * * *